(12) United States Patent
Li et al.

(10) Patent No.: US 12,336,308 B2
(45) Date of Patent: Jun. 17, 2025

(54) GERMANIUM-ON-SILICON AVALANCHE PHOTODETECTOR IN SILICON PHOTONICS PLATFORM, METHOD OF MAKING THE SAME

(71) Applicant: Marvell Asia Pte Ltd, Singapore (SG)

(72) Inventors: Yu Li, Santa Clara, CA (US); Masaki Kato, Palo Alto, CA (US)

(73) Assignee: Marvell Asia Pte Ltd, Singapore (SG)

( * ) Notice: Subject to any disclaimer, the term of this patent is extended or adjusted under 35 U.S.C. 154(b) by 391 days.

(21) Appl. No.: 17/895,753

(22) Filed: Aug. 25, 2022

(65) Prior Publication Data
US 2022/0406955 A1 Dec. 22, 2022

Related U.S. Application Data

(63) Continuation of application No. 17/011,373, filed on Sep. 3, 2020, now Pat. No. 11,450,782.

(51) Int. Cl.
*H10F 30/225* (2025.01)
*H10F 77/40* (2025.01)

(52) U.S. Cl.
CPC ......... *H10F 30/2255* (2025.01); *H10F 77/40* (2025.01)

(58) Field of Classification Search
CPC .. H10F 30/2255; H10F 77/40; H10F 71/1224; H10D 62/108; H10D 62/126; A23B 2/503
See application file for complete search history.

(56) References Cited

U.S. PATENT DOCUMENTS

| 7,209,623 | B2 | 4/2007 | Morse |
| 7,397,101 | B1 * | 7/2008 | Masini ............... H01L 31/1075 257/656 |
| 7,557,387 | B2 | 7/2009 | Ishibashi et al. |
| 8,461,624 | B2 | 6/2013 | Na et al. |
| 9,425,341 | B2 | 8/2016 | Lim et al. |
| 10,797,194 | B2 | 10/2020 | Zeng et al. |

(Continued)

FOREIGN PATENT DOCUMENTS

EP 0150564 A2 8/1985

OTHER PUBLICATIONS

Office Action issued in corresponding European Patent Application No. 21994533.2 dated Feb. 22, 2022.

(Continued)

*Primary Examiner* — Bitew A Dinke

(57) ABSTRACT

A germanium-on-silicon avalanche photodetector includes a silicon device layer of a silicon-on-insulator substrate having a central region characterized by modest-heavy n+ doping state between a first electrode region and a second electrode region in heavy n++ doping state; a first sub-layer of the central region modified to nearly neutral doping state and located from a first depth down to a second depth below a top surface of the silicon device layer; a second sub-layer of the central region modified to modest p doping state embedded from the top surface down to the first depth to interface with the first sub-layer; a layer of germanium with a bottom side attached to the top surface of the second sub-layer; and a third sub-layer embedded into a top side of the layer of germanium, characterized by heavy p++ doping state.

20 Claims, 6 Drawing Sheets

(56) References Cited

U.S. PATENT DOCUMENTS

| | | | |
|---|---|---|---|
| 11,450,782 B2* | 9/2022 | Li | H10F 77/40 |
| 11,652,184 B2* | 5/2023 | Lu | H10F 39/18 |
| | | | 257/431 |
| 2008/0017883 A1* | 1/2008 | Sarid | H10F 30/2255 |
| | | | 257/E31.049 |
| 2012/0126286 A1 | 5/2012 | Na et al. | |
| 2012/0326259 A1* | 12/2012 | Huang | H01L 31/1075 |
| | | | 257/438 |
| 2013/0292741 A1* | 11/2013 | Huang | H10F 30/2255 |
| | | | 257/E31.011 |
| 2014/0291682 A1* | 10/2014 | Huang | H01L 31/1075 |
| | | | 257/55 |
| 2015/0108327 A1* | 4/2015 | Huang | H01L 31/1075 |
| | | | 257/438 |
| 2015/0340538 A1* | 11/2015 | Novack | H10F 30/225 |
| | | | 250/214 A |
| 2016/0211402 A1* | 7/2016 | Joo | H01L 31/022416 |
| 2017/0062508 A1* | 3/2017 | Na | H01L 27/14647 |
| 2017/0317116 A1* | 11/2017 | Celo | H10F 39/18 |
| 2018/0247968 A1* | 8/2018 | Na | H01L 27/14634 |
| 2019/0019903 A1* | 1/2019 | Ye | H01L 31/02327 |
| 2019/0229227 A1* | 7/2019 | Samani | H01L 31/1075 |
| 2019/0378949 A1* | 12/2019 | Simoyama | H10F 30/225 |
| 2021/0091239 A1* | 3/2021 | Chern | H10F 77/147 |
| 2021/0091245 A1* | 3/2021 | Chern | H10F 30/223 |
| 2021/0091246 A1* | 3/2021 | Chern | H01L 31/035254 |
| 2021/0175384 A1* | 6/2021 | Yu | H10F 77/122 |
| 2021/0242354 A1* | 8/2021 | Wang | H10F 77/16 |
| 2022/0336691 A1* | 10/2022 | Samani | H01L 31/1075 |
| 2023/0207719 A1* | 6/2023 | Chien | H01L 31/1804 |
| | | | 257/186 |
| 2024/0145499 A1* | 5/2024 | Liu | H01L 27/14649 |

OTHER PUBLICATIONS

"Rapid-melt-growth based GeSi waveguide photodetectors and avalanche photodetectors," by Neil Na, et al., Proceedings of SPIE, IEEE, US, vol. 8990, Mar. 8, 2014.

* cited by examiner

GERMANIUM-ON-SILICON AVALANCHE PHOTODETECTOR IN SILICON PHOTONICS PLATFORM, METHOD OF MAKING THE SAME

CROSS-REFERENCE TO RELATED APPLICATIONS

The present disclosure is a continuation of U.S. patent application Ser. No. 17/011,373 filed on Sep. 3, 2020. The entire disclosure of the application referenced above is incorporated herein by reference.

BACKGROUND

The present invention relates to optical communication device. More particularly, the present invention provides a CMOS-compatible germanium-on-silicon avalanche photodetector in silicon photonics platform with improved responsivity and low breakdown voltage and a method of making the same.

Over the last few decades, the use of broadband communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. Additionally, Internet of Things certainly will create even higher demand on data communication. With such high demands on data and data transfer, existing data communication systems need to be improved to address these needs.

As science and technology are updated rapidly, processing speed and capacity of the computer increase correspondingly. With the advances of optical communication technology and applications driven by the market demand on increasing bandwidth and decreasing package footprint, more intensive effort and progress have been seen in the development of silicon photonics. With its low-cost and CMOS compatible fabrication process, integration of electro-photonic circuits in silicon-on-insulator (SOI) substrate for forming high-speed high-data-rate silicon photonics devices has continuously gaining its market in broadband optic-electric communication system.

With the increasing demand of high bandwidth and high integrability in optical communication system, the optical components in a transmission link increases, leading to increased optical loss. Optionally, the high-loss silicon photonic components need to be optimized, for example, by redesigning improved modulator, fiber input/output coupler, et al. Optionally, the responsivity of photodetectors at the receiving end may be improved by making novel CMOS-compatible avalanche photodetectors with low breakdown voltage, high-gain, wide-bandwidth, and low dark-current.

SUMMARY

The present invention relates to optical communication device. More particularly, the present invention provides a CMOS-compatible avalanche photodetector in silicon photonics platform with improved responsivity and a method of making the same. Merely by example, the present invention discloses a germanium-on-silicon avalanche photodetector with a novel separate absorption, charge, and multiplication design and a method for forming the same on a SOI substrate free of epitaxy silicon, though other applications are possible.

In a specific embodiment, the present invention provides a germanium-on-silicon photodetector. The germanium-on-silicon photodetector includes a silicon device layer of a silicon-on-insulator substrate, including a central region characterized by modest-heavy n+ doping state between a first electrode region and a second electrode region. The germanium-on-silicon photodetector further includes a first sub-layer of the central region modified to nearly neutral doping state and located from a first depth down to a second depth below a top surface of the silicon device layer. Additionally, the germanium-on-silicon photodetector includes a second sub-layer of the central region modified to modest p doping state embedded from the top surface down to the first depth to interface with the first sub-layer. Furthermore, the germanium-on-silicon photodetector includes a layer of germanium with a bottom side attached to the top surface of the second sub-layer. Moreover, the germanium-on-silicon photodetector includes a third sub-layer embedded into a top side of the layer of germanium, characterized by heavy p++ doping state.

In another specific embodiment, the present invention provides a Ge/Si avalanche photodetector (Ge/Si APD). The Ge/Si APD includes a silicon device layer of a silicon-on-insulator substrate including a width of central region in intrinsic state laterally between a first electrode region in heavy n++ doping state and a second electrode region in heavy p++ doping state. Additionally, the Ge/Si APD includes a first sub-region in a lower portion of the central region modified to modest-heavy n+ doping state located beneath a first depth under a top surface of the silicon device layer and expanded laterally over a first part of the width in contact with the first electrode region. The Ge/Si APD further includes a second sub-region in the lower portion of the central region modified to a modest-heavy p+ doping state located beneath a second depth under the top surface of the silicon device layer and expanded laterally over a second part of the width in contact with the second electrode region. The second sub-region is separated from the first sub-region laterally by an intrinsic silicon region with a third part of the width of the central region. Furthermore, the Ge/Si APD includes a sub-layer of silicon modified to modest p doping state in an upper portion of the central region from the top surface of the silicon device layer down to interface each of the first sub-region, the second sub-region, and the intrinsic silicon region. Moreover, the Ge/Si APD includes a layer of germanium formed on the sub-layer of silicon in modest p doping state.

In another alternative embodiment, the present invention provides a method for forming a Ge-on-Si avalanche photodetector with novel separate absorption, charge, and multiplication design. The method includes a step of providing a silicon device layer of a SOI substrate including a width of central region optionally retained in intrinsic state or modified to a modes-heavy n doping state. Additionally, the method includes modify the central region to multiple sub-regions with different doping states to form either a vertical PIN junction or a lateral PIN junction at a lower portion of the central region. The vertical PIN junction includes a first sub-layer of silicon in nearly intrinsic state located between a second depth down to a first depth below a top surface of the silicon device layer and a second sub-layer of silicon in modest p doping state located from the top surface down to the first depth to interface with the first sub-layer. The lateral PIN junction is formed in a lower portion of the central region including a first sub-region in n+ doping state and a second sub-region in p+ doping state respectively takes two parts of the width of the central region leaving a third sub-region in intrinsic state in the middle and a sub-layer of silicon in upper portion of the central region being modified to a modest p doping state. The method then includes growing a layer of germanium on and within the lateral scale of the second sub-layer of silicon in modest p doping state of the vertical PIN junction or on and within the lateral scale of the sub-layer of silicon in modest p doping state of the lateral PIN junction.

Many benefits can be achieved with the present invention on a germanium-on-silicon avalanche photodetector (APD) fabricated in a SOI substrate. The APD employs a novel separate absorption, charge, and multiplication (SACM) design with a narrow multiplication region. The novel SACM junction structure leads to a low breakdown voltage desired for high-speed optical transceiver based on silicon photonics. Additionally, various structural embodiments of the germanium-on-silicon APD are all formed in a fabrication process free of Si epitaxy, simplifying manufactural process for mass production.

The present invention achieves these benefits and others in the context of CMOS-compatible process for fabricating silicon photonics devices. However, a further understanding of the nature and advantages of the present invention may be realized by reference to the latter portions of the specification and attached drawings.

BRIEF DESCRIPTION OF DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DESCRIPTION

The present invention relates to optical communication device. More particularly, the present invention provides a CMOS-compatible avalanche photodetector with improved responsivity and a method of making the same. Merely by example, the present invention discloses a germanium-on-silicon avalanche photodetector with a novel separate absorption, charge, and multiplication design and a method for forming the same on a SOI substrate without using epitaxy silicon, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, center, upper, lower, side, shallow, narrow, modest, heavy, clockwise and counter clockwise have been used for convenience purposes only and are not intended to imply any particular fixed direction. Instead, they are used to reflect relative locations and/or directions between various portions of an object.

Figure 1:
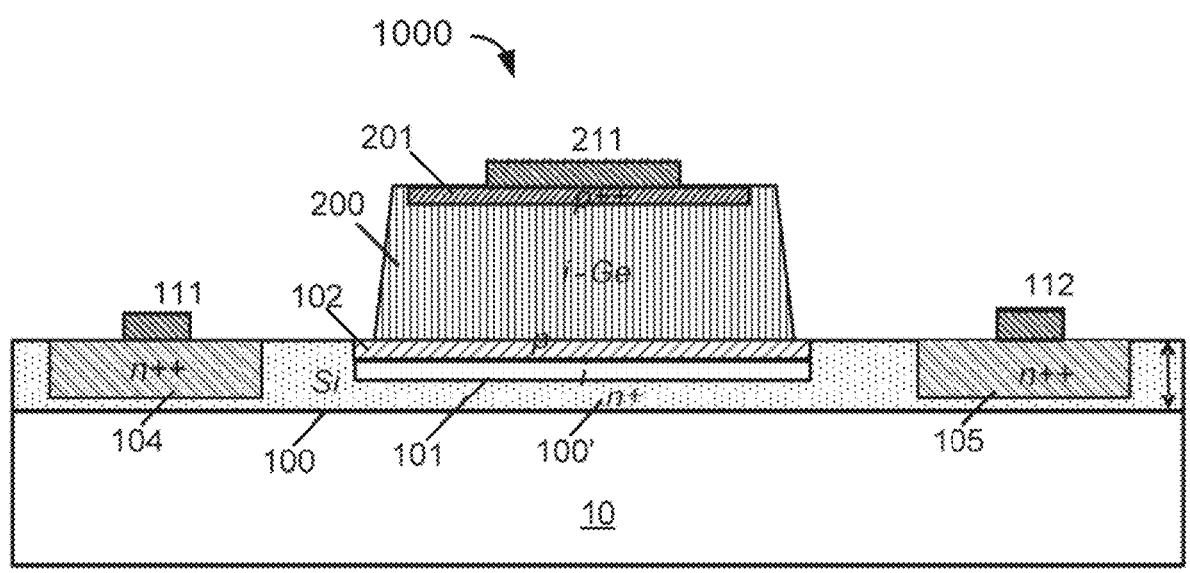
FIG. 1 is a schematic diagram of a germanium-on-silicon avalanche photodetector according to an embodiment of the present disclosure.

FIG. 1 is a schematic diagram of a germanium-on-silicon avalanche photodetector according to an embodiment of the present disclosure. This diagram is merely an example, which should not unduly limit the scope of the claims. One of ordinary skill in the art would recognize many variations, alternatives, and modifications. As shown, a germanium-on-silicon (Ge/Si) avalanche photodetector (APD) 1000 in an embodiment is formed on a silicon device layer 100 in a substrate 10. In particular, the silicon device layer 100 is an intrinsic silicon layer overlying a buried oxide layer 10 of a silicon-on-insulator (SOI) substrate. In the embodiment, the silicon device layer 100 is modified in electrical property by doping n-type impurity up to a modest heavy doping level, namely, in n+ doping characteristics. The Ge/Si APD 1000 includes a layer of germanium 200 formed in a hut structure overlying the silicon device layer 100. Due to lattice difference between germanium and silicon, a tensile stress is created in the layer of germanium 200 to form the hut structure, the bottom side of the layer of germanium 200 that interfaces with a top surface of the silicon device layer 100 is wider than the top side. Further, the Ge/Si APD 1000 includes two electrode regions embedded in the silicon device layer 100 separately with a first electrode region 104 and a second electrode region 105. Each of the first electrode region 104 and the second electrode region 105 is, within a defined lateral scale, doped with n-type impurity up to heavy doping level, i.e., in n++ doping state. Additionally, for the silicon device layer 100 is modified with a vertical PIN junction structure in a confined portion of a central region in the silicon device layer 100 between the first electrode region 104 and the second electrode region 105. Optionally, the layer of germanium 200 has a lateral dimension smaller than that of the central region, i.e., no direct contact between the layer of germanium 200 and either of the two electrode regions.

In the embodiment, the vertical PIN junction structure is embedded vertically into a part of the central region of the silicon device layer 100, including a n+ doping region 100' at bottom, a nearly intrinsic region 101 in the middle, and a p doping region 102 with modest doing level of p-type impurity on top. Optionally, the vertical PIN junction structure embedded vertically remains to be part of the silicon device layer with silicon as its major composition but with different doping levels of electrical impurities in respective sub-layers in the silicon device layer 100. For example, the n+ doping region 100' at bottom is essentially a part of the original silicon device layer 100 which is modified from intrinsic state to the n+ doping state by doing n-type ionic impurity. Optionally, the nearly intrinsic silicon region 101 in the middle of the vertical PIN junction structure is referred to a first sub-layer 101 of a first thickness measured from a first depth below the top surface of the silicon device layer 100 down to a second depth at an interface with the n+ doping region 100' at bottom. Optionally, the first sub-layer is modified to nearly intrinsic state from original n+ doping state by implanting p-type impurity with a proper dose and depth control to allow proper dose of p-type impurity to neutralize the n-type impurity therein. Additionally, the p doping region 102 on top is referred to a second sub-layer of silicon 102 in p doping state with a second thickness measured from the top surface of the silicon device layer 100 down to the first depth at an interface with the first sub-layer 101. Optionally, the second sub-layer of silicon 102 is modified to a modest p doing state by further implanting p-type impurity with proper dose and depth control.

In the embodiment, the vertical PIN junction structure as described above is formed with a lateral scope smaller than that of the central region of the silicon device layer 100. The lateral scopes of the P-region represented by the second sub-layer of silicon 102 and I-region represented by the first sub-layer of silicon 101 in the vertical PIN structure are not in contact with either the first electrode region 104 or the second electrode region 105. Alternatively in the embodiment, the second sub-layer 102 is at least separated from the first electrode region 104 by a gap of silicon which is part of original silicon device layer 100 modified in n+ doping state. Within the lateral scope of the vertical PIN junction structure, the top surface of the second sub-layer 102 in p doping state is the same top surface of the silicon device layer 100. The layer of germanium 200 of the Ge/Si APD 1000 is attached fully within the lateral scope of the vertical PIN junction structure. In fact, the bottom side of the layer of germanium 200 is interfaced only with the top surface of the second sub-layer 102 of the vertical PIN junction structure.

In the embodiment, the Ge/Si APD 1000 includes a third electrode region 201 formed as a shallow sub-layer embedded in top side of the layer of germanium 200 having p++ doping state, with p-type impurity heavily doped therein. Optionally, the layer of germanium 200 is configured to be in intrinsic state. Optionally, the layer of germanium 200 is configured to be in a state with light doping concentration on the order of 1E16 cm$^{-3}$. Both the first electrode region 104 and the second electrode region 105 are configured to be n++ doping state with heavily doped n-type impurity. Each of the first electrode region 104, the second electrode region 105, and the third electrode region 201 is configured to bound with a metallic contact material to form respective electrodes: a first electrode 111, a second electrode 112, and a third electrode 211. The first electrode 111 and the second electrode 112 can be coupled together electrically to form a cathode of the Ge/Si APD 1000 while the third electrode 211 along forms an anode of the Ge/Si APD 1000. The Ge/Si avalanche photodetector (APD) 1000 is operated by applying high reverse bias voltage between the anode and cathode of the photodiode that exploits the photoelectric effect with high internal current gain due to impact ionization (avalanche effect) to convert light into electricity with high responsivity.

The layer of germanium 200 in intrinsic state directly attached to the embedded Si-based vertical PIN junction structure forms a novel separate absorption, charge, and multiplication (SACM) structure in the Ge/Si avalanche photodetector. For Germanium with a bandgap of 0.67 eV, the absorption spectra cover the optical communication O band and C band, making the layer of germanium a good light absorption region of the Ge/Si based photodetector. One major advantage of the novel SACM structure is that the vertical PIN junction structure is formed within in existing silicon device layer of the SOI substrate without need of a silicon epitaxy process. Other advantages include well-defined charge layer to fully separate light absorption layer in intrinsic germanium from the multiplication layer in intrinsic silicon for the Ge/Si APD. The multiplication layer can be controlled to relatively thin width (or thickness) to yield a desired low breakdown voltage for the Ge/Si APD.

Figure 2:
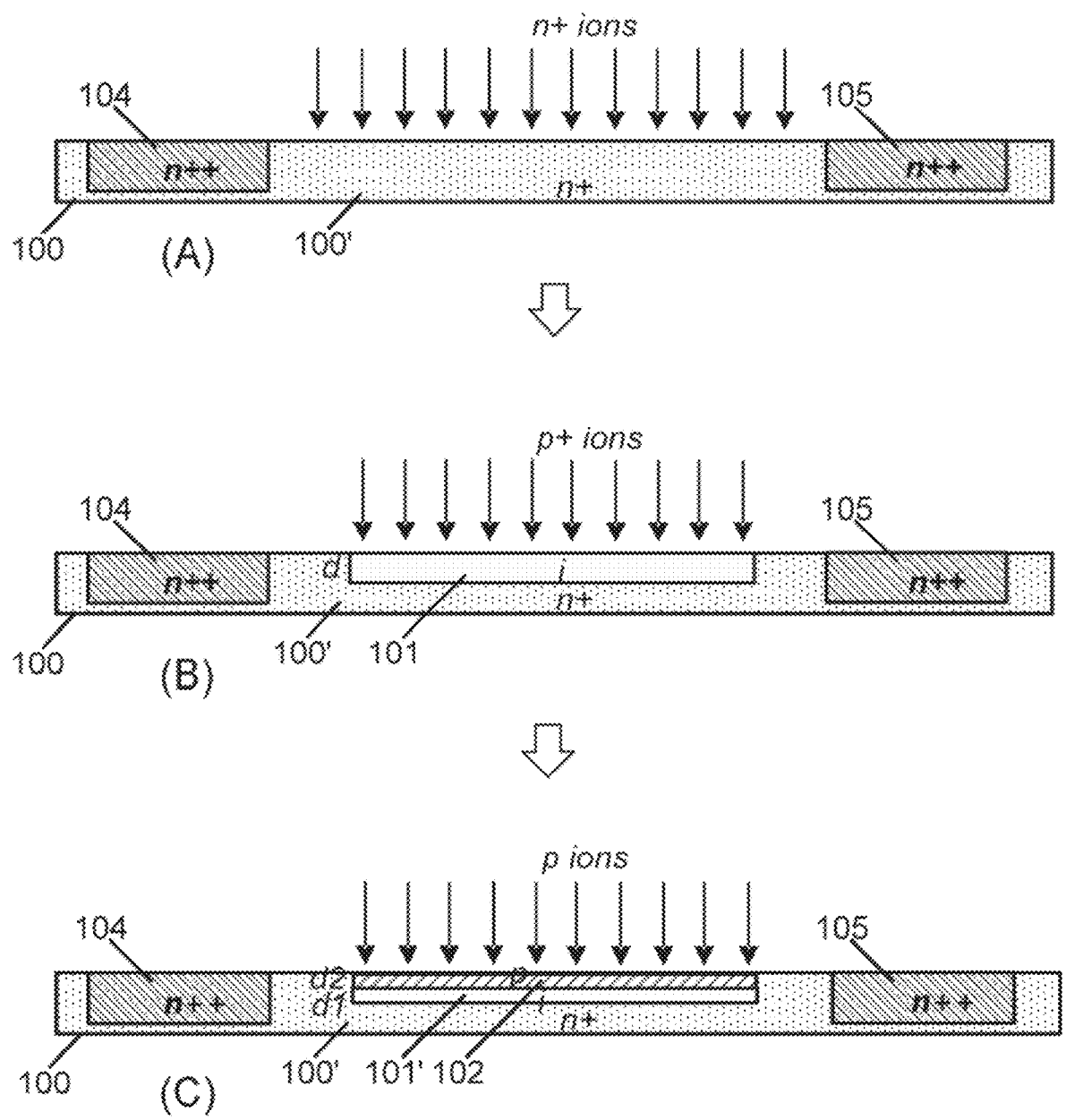
FIG. 2 is a simplified diagram showing a method of forming the germanium-on-silicon avalanche photodetector of FIG. 1 according to an embodiment of the present disclosure.

FIG. 2 shows a method of forming the germanium-on-silicon avalanche photodetector of FIG. 1 according to an embodiment of the present disclosure. This diagram is merely an example, which should not unduly limit the scope of the claims. One of ordinary skill in the art would recognize many variations, alternatives, and modifications. As shown, a silicon device layer 100 of a SOI substrate can be firstly treated throughout the layer thickness via a doping possess to modify from an intrinsic state a n+ doping state, see part (A) of FIG. 2. This is achieved by performing implantation of n-type ionic impurity into the silicon device layer 100 in intrinsic state. Optionally, a modest heavy doping level is reached to obtain the n+ doping state for the silicon device layer 100. Optionally, two electrode regions in n++ doping state, 104 and 105, are also formed during this doping process with separate region definition and dose control. A central region 100' of the silicon device layer in n+ doping state between the two electrode regions of n++ doping state is defined after this process.

Part (B) of the FIG. 2 shows an ion-implantation process being performed to dope p-type ionic impurity with a modest high dose into a portion of the central region 100' with a predefined lateral scope down to a certain depth d below the top surface of the silicon device layer 100. The dose and ionic energy of the p-type ionic impurity doped through the ion-implantation process can be well controlled to create a nearly intrinsic region 101 by using the p-type ionic impurity to neutralize the n-type ionic impurity previously doped therein. The intrinsic silicon region 101 is substantially embedded in the silicon layer 100 from the top surface down to the certain depth d. Optionally, the intrinsic silicon region 101 in lateral direction is fully isolated from either the first electrode region 104 or the second electrode region 105.

Part (C) of the FIG. 2 further shows another ion-implantation process being performed to dope p-type impurity with a modest dose into the newly formed nearly intrinsic silicon region 101 within substantially same lateral scope. This ion-implantation process is executed with controlled dose and ionic energy to transform an upper portion of the intrinsic region 101 to a second sub-layer of silicon 102 in p doping state with a shallower depth d2 below the top surface of the silicon device layer 100 and to keep a lower portion of the intrinsic silicon region 101 to a narrower first sub-layer of intrinsic silicon 101' with a thickness d1=d−d2. Thus, a vertical PIN junction structure is embedded in a portion of the central region 100' of the silicon device layer 100, including a second sub-layer of silicon 102 in p doping state with a thickness d2 overlying a first sub-layer of intrinsic silicon 101' with a thickness d1 over bottom portion of the central region 100'. The top surface of the silicon device layer 100 is also the top surface of the second sub-layer of silicon 102 in p doping state of the vertical PIN junction structure. The germanium layer (200 in FIG. 1) of the Ge/Si APD 1000 can be formed directly on the second sub-layer of silicon 102 in p doping state of the embedded vertical PIN junction structure without any epitaxial silicon layer being added in between. The germanium layer 200 (which is in intrinsic state) serves a light absorption region for the Ge/Si APD to convert photons to electron-hole pairs. The first sub-layer of intrinsic silicon 101' of the vertical PIN junction structure becomes a carrier multiplication region under avalanche effect induced by reversed bias voltage applied to the Ge/Si APD. While, the second sub-layer of silicon 102 in p doping state on top part of the vertical PIN junction structure severs a separate charge barrier to prevent the electrical field in the germanium layer 200 reaching avalanche-required level. Thus, in the germanium layer 200, the carriers that contribute to the dark current will not get multiplied. Only the carriers in the multiplication region in the silicon device layer 100 will be multiplied. As the Si has less defects compare to Ge, keeping the multiplication region only in Si will help lower the dark current. This is the beneficial of SACM structure for the Ge/Si APD compares to normal APD.

Figure 3:
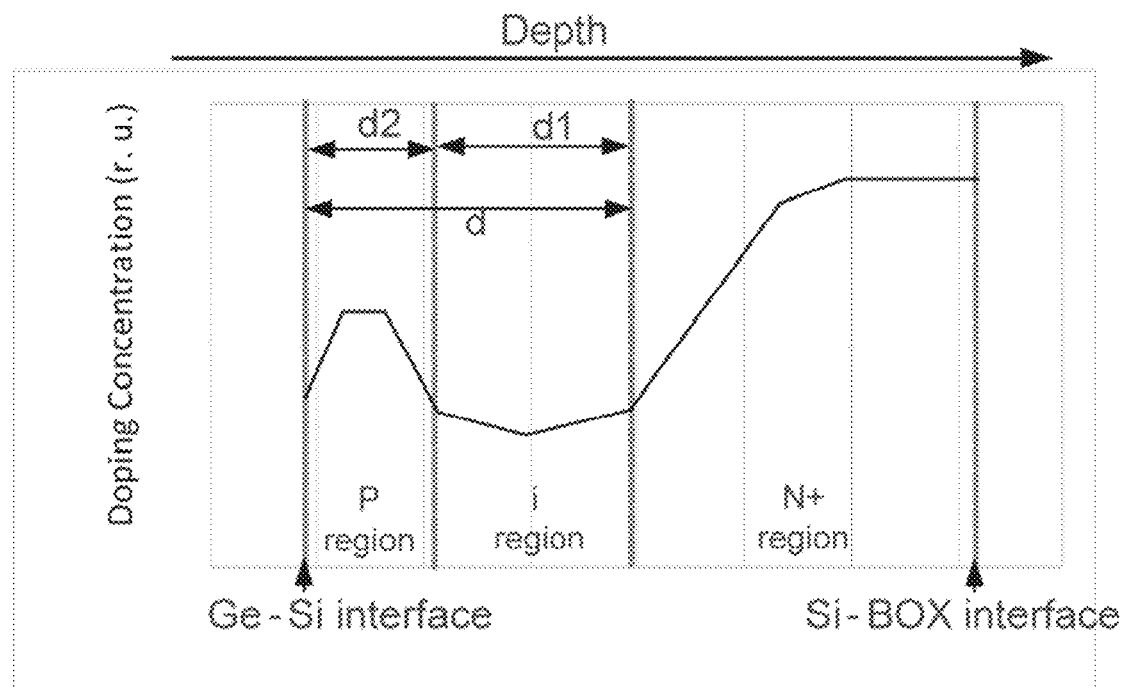
FIG. 3 is a schematic plot of doping profile of a PIN junction in the germanium-on-silicon avalanche photodetector according to an embodiment of the present disclosure.

FIG. 3 is a schematic plot of doping profile of a vertical PIN junction in the germanium-on-silicon avalanche photodetector according to an embodiment of the present disclosure. As shown, along a depth direction the vertical PIN junction structure is formed from Ge—Si interface to Si-BOX interface, i.e., throughout a whole thickness of the silicon layer of the SOI substrate. From the Ge—Si interface, firstly a sub-layer of silicon in p doping state of a depth d2 followed by a sub-layer of silicon in intrinsic state with a depth d1 belongs to ion-implantation-modified portion of the silicon layer. Deeper in the depth direction is a sub-layer of silicon in n+ doping state, which belongs to the original portion of the silicon layer that interfaced with the buried oxide (BOX) layer. The sub-layer of silicon in p doping state has modest p-type doping concentration. The sub-layer of i-region is nearly intrinsic with p-n neutralized electrical property. The sub-layer of silicon in n+ doping state has increasing n+ doping saturated at modest-heavy level. In an embodiment, as shown in FIG. 2, the doping concentration throughout the vertical PIN junction is achieved by performing ion-implantation of p-type ions with controlled dose and ionic energy into the silicon layer with pre-doped modest heavy level of n+ dopants. Optionally, the second sub-layer of silicon in p doping state is formed from the Ge—Si interface with a depth d2 in a range from about 50 nm to about 100 nm. This sub-layer of silicon in p doping state in the vertical PIN junction provides a charge barrier for the Ge/Si APD. The charge layer is controlled to a relatively thin thickness to prevent punch-through voltage to be larger than avalanche voltage. Thus, in this case, a situation can be established wherein the electrical field in the silicon layer already reaching avalanche, while the electrical field in the germanium layer is still too low to allow carriers reaching saturation velocity. The thickness of the second sub-layer of p-region is also controlled to be not too small to loss its ability of preventing electrical field in the germanium layer from reaching avalanche-level to keep a low dark current when the APD is operated in avalanche mode. Optionally, the first sub-layer of silicon in intrinsic state has a thin thickness d1 in a range from 0 to 150 nm. This first sub-layer of silicon in intrinsic state in the PIN junction serves as a carrier multiplication region for the Ge/Si APD. The thin thickness (or width) of the carrier multiplication region would yield a low-breakdown voltage for the Ge/Si APD with high-gain in photo-electrical current over wide bandwidth. The total thickness of silicon device layer is a 220 nm thin layer based on an industrial standard SOI substrate used for devices in silicon photonics platform. Optionally, the thickness of the second sub-layer of silicon in p doping state and the thickness of the first sub-layer of silicon in intrinsic state are controlled to keep the punch-through voltage slightly lower than the breakdown voltage of APD. As the thickness d1 of the first sub-layer of silicon in intrinsic state is reduced to zero, the vertical PIN junction structure is simplified to a PN junction. In this case, the depletion region of the PN junction will serve the carrier multiplication region.

Figure 4:
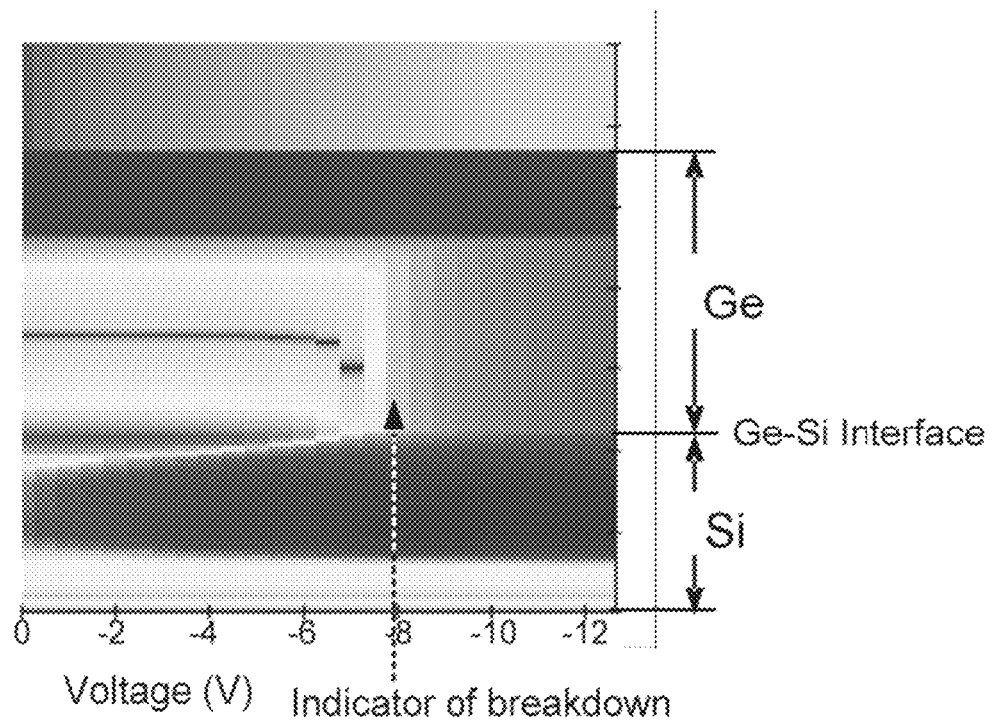
FIG. 4 shows an exemplary electrical field distribution of the germanium-on-silicon avalanche photodetector of FIG. 1 versus bias voltage according to an embodiment of the present disclosure.

FIG. 4 shows an exemplary electrical field distribution of the germanium-on-silicon avalanche photodetector of FIG. 1 versus bias voltage according to an embodiment of the present disclosure. This diagram is merely an example, which should not unduly limit the scope of the claims. One of ordinary skill in the art would recognize many variations, alternatives, and modifications. As a reverse bias voltage is applied to the germanium-on-silicon avalanche photodiode detector to induce electrical field across the vertical PIN junction to cause electrons of the electron-hole pairs generated from light absorption to drift towards the n+ sub-region of the silicon device layer (and eventually being led to the two electrode regions in n++ doping state) while to cause holes of the electron-hole pairs to drive towards the p++ sub-layer on top of the layer of germanium. As shown in FIG. 4, the electrical field distribution varies across the Ge—Si interface of the APD 1000 as the versus reverse bias voltage increases from 0V to −12V. The electrical field is high mostly in the silicon device layer and low in layer of germanium (i-Ge), separated properly by the charge region provided with the sub-layer of silicon in p doping state. For relatively small bias voltage (<−8V), the charge region at the Ge—Si interface provided by the sub-layer of silicon in p doping state in the silicon device layer effectively prevents the charges flowing into the layer of germanium in intrinsic state. The avalanche in silicon layer is not happening yet when the reversed bias voltage is <8V. It happens slightly after the punch-through. The electrical field distribution changes dramatically with strong increase in the layer of germanium when the bias voltage is around −8V, indicating an onset of punch-through of the APD. With an aim for applying the presently disclosed Ge/Si APD to integrated optical transceivers, the avalanche photodiode design needs to have low breakdown voltage, high-gain, wide-bandwidth, and low dark current. A narrow multiplication region realized by a sub-layer of nearly intrinsic silicon in the PIN junction embedded in the layer of n+ silicon earns the benefit of the low breakdown voltage of −10V or smaller. Besides, embedding the whole vertical PIN junction structure in the nominal silicon device layer of the SOI substrate does not require additional Si epitaxy process, which simplifies the fabrication process for mass production.

Figure 5:
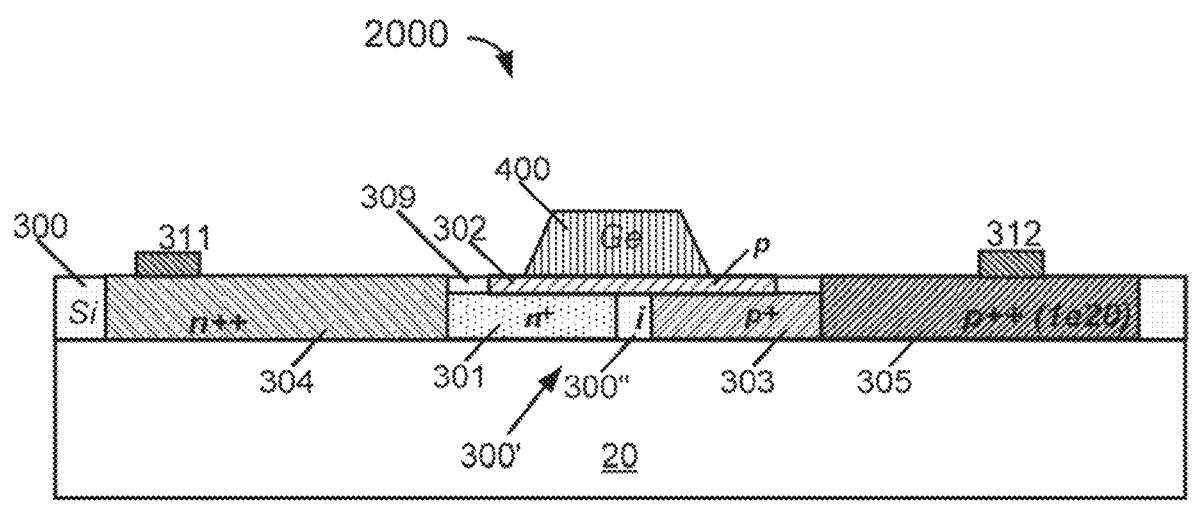
FIG. 5 is a schematic diagram of a germanium-on-silicon avalanche photodetector according to another embodiment of the present disclosure.

In some alternative embodiments, germanium-on-silicon avalanche photodetector can be provided with a lateral PIN junction instead of the vertical structure shown in FIG. 1. FIG. 5 is a schematic diagram of a germanium-on-silicon avalanche photodetector according to another embodiment of the present disclosure. This diagram is merely an example, which should not unduly limit the scope of the claims. One of ordinary skill in the art would recognize many variations, alternatives, and modifications. As shown, a germanium-on-silicon avalanche photodetector (Ge/Si APD) 2000 is provided on a silicon layer 300 of a substrate 20. Optionally, the silicon layer 300 is provided as a natural silicon device layer over a buried oxide (BOX) layer 20 of a silicon-on-insulator (SOI) substrate. Optionally, the silicon device layer 300 is in intrinsic electrical state substantially without either n-type or p-type doping impurities. In the embodiment, the Ge/Si APD 200 includes a laterally formed PIN junction structure embedded in a central region 300' of the silicon device layer 300 between a first electrode region 304 and a second electrode region 305. Optionally, the first electrode region 304 is a portion of the silicon device layer 300 being transformed from intrinsic state to a heavy n++ doing state and the second electrode region 305 is a separate portion of the silicon device layer 300 being heavily doped with p-type impurity to become a p++ doping state. Optionally, the doping concentration of the p++ state is on the order of about 1E20 cm$^{-3}$.

Referring to FIG. 5, the lateral PIN junction structure is substantially embedded in a lower part of the central region 300' of the silicon device layer 300. In an embodiment, a portion of the lower part of the central region 300' is transformed from an intrinsic state into a modest heavy doped n+ sub-region 301. Another portion nearby of the lower part of the central region 300' is transformed from the intrinsic state into a modest heavy doped p+ sub-region 303, leaving relatively small intrinsic silicon region 300" in between. The n+ sub-region 301 is formed laterally in the silicon device layer to be in contact with the first electrode region 304 in n++ doping state and the p+ sub-region 303 is laterally in contact with the second electrode region in p++ doping state. Optionally, the n+ sub-region 301 is formed at a first depth below the top surface of the silicon device layer 300. Optionally, the p+ sub-region 303 is formed at a second depth below the top surface of the silicon device layer 300. Optionally, the first depth is nearly the same as the second depth. Optionally, the upper part of the central region 300' of the silicon device layer 300 is transformed from top surface down, at least partially in lateral scale, to a sub-layer of silicon 302 in p doping state. The sub-layer of silicon 302 in p doping state is configured to interface directly with the n+ sub-region 301 at the first depth as well as to form a direct interface with the p+ sub-region 303 at the second depth. Optionally, the lateral PIN junction structure at lower part of the central region 300' and the sub-layer of silicon 302 in p doping state can be formed via controlled ion-implantation with lateral photomasking and depth/dose definition.

Referring to FIG. 5 again, a layer of germanium 400 then is grown on the silicon device layer with stress to form a hut structure. In particular, the layer of germanium 400 is laterally formed overlying a part of the sub-layer of silicon 302 in p doping state above the lateral PIN junction structure as mentioned above. Optionally, the layer of germanium 400 is formed by epitaxial growth directly from the top surface of silicon device layer, i.e., the top surface of the sub-layer of silicon 302 in p doping state. Due to lattice mismatch between Ge and Si, the layer of germanium has strong tensile stress which leads to relatively small hut structure on top of the sub-layer of silicon 302 with many threading defects therein. Optionally, the first electrode region 304 and the second electrode region 305 are configured to couple with respective metallic contact material to form a first electrode 311 and a second electrode 312, from which a bias voltage can be applied to operate the Ge/Si APD 2000.

Figure 6:
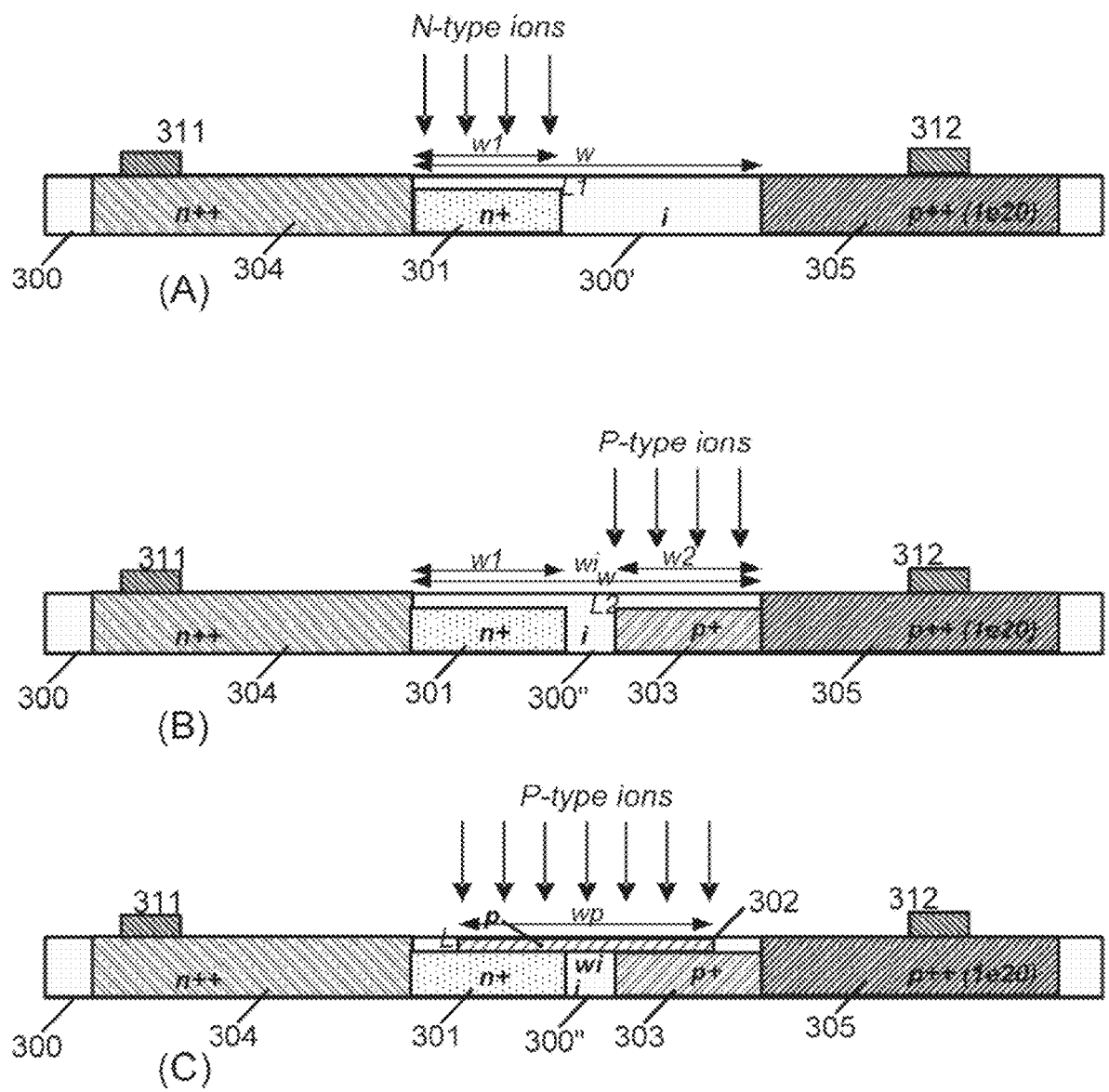
FIG. 6 is a simplified diagram showing a method of forming a lateral PIN junction for the germanium-on-silicon avalanche photodetector of FIG. 5 according to an embodiment of the present disclosure.

FIG. 6 shows, in a simplified diagram, a method of forming a lateral PIN junction for the germanium-on-silicon avalanche photodetector of FIG. 5 according to an embodiment of the present disclosure. This diagram is merely an example, which should not unduly limit the scope of the claims. One of ordinary skill in the art would recognize many variations, alternatives, and modifications. As shown, a silicon device layer 300 of a SOI substrate is provided with an intrinsic electric property, i.e., an intrinsic silicon layer. It can be firstly processed to form two electrode regions. A first electrode region 304 is in heavy doping level of n-type impurity to possess a n++ doping state and a second electrode region 305 is in heavy doping level of p-type impurity to possess a p++ doping state, see part (A) of FIG. 6. As the first electrode region 304 and the second electrode region 305 are formed according to a predefined pattern, a central region 300' of a certain width w between the first electrode region 304 and the second electrode region 305 is formed, which remains to be intrinsic silicon the same as original silicon device layer 300.

In the embodiment, part (A) of FIG. 6 shows a step of an ion-implantation process being performed to dope a modest-heavy level of n-type ionic impurity into a first sub-region 301 within the central region 300'. Optionally, the dose of the n-type ionic impurity can be well controlled to transform original intrinsic state to a n+ doping state, a doping level lower than that in the first electrode region 304. Optionally, the ion-implantation process includes patterning and masking to make the first sub-region 301 laterally expanded over a width w1 which is a part of the width w of the central region 300'. The patterning process is specifically defined a location of the first sub-region 301 to make it laterally in contact with the first electrode region 304 in n++ doping state. Optionally, the ionic energy of the n-type ionic impurity can be well controlled to allow the impurity ions to penetrate into a lower portion of the central region 300'. For example, the first sub-region 301 in n+ doping state is formed substantially from a first depth L1 under the top surface down to the bottom interface (with BOX layer) of the silicon device layer 300. The upper portion of the central region 300' from the top surface to the first depth L1 can still be kept in intrinsic state. Optionally, the first depth L1 is about 50 nm to 100 nm. The thickness of the first sub-region 301 in n+ doping state can be about 120 nm to 170 nm, provided that the thickness of the silicon device layer is 220 nm.

Similarly, part (B) of FIG. 6 shows another step of ion-implantation process being performed to dope a modest-heavy level of p-type ionic impurity into a second sub-region 303 of the central region 300'. The dose of the p-type ionic impurity can be well controlled to transform original intrinsic state in that region to a p+ doping state. Optionally, the process can be set its lateral scale to a width w2 as a part of the width w of the central region 300' and ensure it to be laterally in contact with the second electrode region 305 in p++ doping state. The doping level of the second sub-region 303 is lower than that of the second electrode region 305. Optionally, the ionic energy of the p-type impurity also can be controlled to allow the impurity ions to penetrate into a lower portion of the central region 300'. For example, the second sub-region 303 in p+ doping state is formed substantially from a second depth L2 under the top surface down to the bottom interface (with the BOX layer) of the silicon device layer 300. The upper portion of the central region 300' from the top surface to the first depth L2 can still be kept in intrinsic state. Optionally, the first depth L2 is about 50 nm to 100 nm. Optionally, the second depth L2 is substantially equal to the first depth L1, though perfect leveling of those two depths is not necessary. Optionally, the step for forming the second sub-region 303 in p+ doping state can be swapped in order with the step for forming the first sub-region 301 in n+ doping state.

Referring to part (B) of FIG. 6, as the two steps of ion-implantation process are executed for respectively forming the first sub-region 301 and the second sub-region 303 in the lower portion of the central region 300', a gap of intrinsic silicon region, an i-region 300", is naturally formed in the middle with a lateral dimension being limited to w1=w−w1−w2. Thus, the method shown in part (A) and part (B) of FIG. 6 leads to a formation of a lateral PIN junction structure including the second sub-region 303 in p+ doping state, the intrinsic silicon region 300", and the first sub-region 301 in n+ doping state. The lateral PIN junction structure is submerged beneath the first depth L1 or the second depth L2 under the top surface of the silicon device layer 300 in a lower portion of central region 300'. Optionally, the width w1 of the i-region 300" can be even reduced to zero when the first sub-region 301 laterally in touch with the second sub-region 303. In this case, the PIN junction is turned into a PN junction.

In the embodiment shown in FIG. 6, the two steps described above leave the upper portion of the central region 300' from the top surface down to the first depth L1 or the second depth L2 can be controlled in relative low doping concentration or nearly in intrinsic state. Part (C) of FIG. 6 shows another step of the ion-implantation process is executed to dope a modest level of p-type impurity into the upper portion of the central region 300'. Again, with patterning, dose, and ionic energy controls, a sub-layer of silicon 302 in modest p doping state can be formed with a certain lateral dimension of wp and embedded with a thickness L down into the upper portion of the central region 300'. Optionally, the lateral dimension wp of the sub-layer of silicon 302 in p doping state is smaller than the width w of the central region 300'. Optionally, the sub-layer of silicon in p doping state can be laterally in touch with the second electrode region 305 in p++ doping state. At least, a gap of intrinsic silicon region is left laterally between the sub-layer of silicon 302 in p doping state and the first electrode region 304 in n++ doping state. Optionally, the thickness L of a portion of the sub-layer of silicon 302 is equal to L1 to at least allow the sub-layer of silicon 302 to interface with the first sub-region 301 in n+ doping state. The thickness L in another portion of the sub-layer of silicon 302 is equal to L2 to at least allow the sub-layer of silicon 302 to also interface with the second sub-region 303 in p+ doping state. Optionally, L, L1, and L2 are nearly the same, though perfect leveling is not necessary.

Referring back to FIG. 5, the sub-layer of silicon 302 in p doping state with a thickness L embedded into the upper portion of the central region 300' effectively covers the lateral PIN junction formed in the lower portion of the central region 300'. On the top surface of the sub-layer of silicon 302, which is the same top surface of the silicon device layer 300, the layer of germanium 400 can be formed. Note, no epitaxial silicon layer is needed, the layer of germanium 400 is directly grown via Ge epitaxy on the top surface of the sub-layer of silicon 400 which is just the top surface of the silicon device layer 300 of the SOI substrate. As the lateral dimension of the sub-layer of silicon 302 is nearly as wide as the width of the central region 300', the lateral scale of the layer of germanium 400 needs to be smaller than the lateral dimension of the sub-layer of silicon 302 but fairly large to allow it is grown with stress up to certain thickness desired for forming a Ge/Si avalanche photodetector. In fact, for the Ge/Si APD 2000 to be applied as photodetector in avalanche mode, the layer of germanium 400 with desired thickness is configured to be a light absorption layer coupled with a planar waveguide in silicon photonics device for detecting optical signals with high responsivity in high-speed telecommunication applications. The intrinsic silicon region 300" in the lateral PIN junction will serve as a carrier multiplication region as the Ge/Si APD operates in avalanche mode. Due to the large (4%) lattice mismatch between Ge and Si, the layer of germanium 400 suffers high threading defects, which may lead to large dark current. The issue becomes severe in avalanche mode. Thus, the sub-layer of silicon 302 in modest p doping state plays a critical role to serve as a charge barrier to separate the light absorption region in the layer of germanium 400 from the carrier multiplication region in the intrinsic silicon region 300". This barrier effectively prevents the electrical field in the layer of germanium 400 reaching avalanche level that multiplies carrier therein, decreasing the dark current in the light absorption region in the layer of germanium 400.

Optionally, the doping concentration of p-type impurity in the sub-layer of silicon 302 is controlled in a range between $1E12$ cm$^{-3}$ and $5E13$ cm$^{-3}$. In an embodiment, the sub-layer of silicon 302 in p doping state serves as a charge barrier characterized by a punch through voltage at which the electrical field (strong in the silicon device layer) can punch through the sub-layer of silicon 302 into the layer of germanium 400. Assuming a higher doping concentration is given to the sub-layer of silicon, the punch through voltage increases. With a lower doping concentration, the strong electrical field in the carrier multiplication region can easily punch through the layer of silicon in p state into the layer of germanium at low bias voltage, which leads to avalanche effect in the layer of germanium to cause high dark current. Therefore, it is better to control the sub-layer of silicon 302 with a modest p doping level to keep an optimum punch-through voltage slightly smaller than the breakdown voltage for the Ge/Si photodetector to operate in avalanche mode.

In the embodiment, the step shown in part (A) of FIG. 6 for forming the first sub-region 301 under the first depth L1 and the step shown in part (B) of FIG. 6 for forming the second sub-region 303 under the second depth L2 set a basis for the step shown in part (C) of FIG. 6 to form the sub-layer of silicon 302 in p doping state with a thickness L about the same as L1 or L2 in the upper portion the central region 300' of the silicon device layer 300. The thickness L of the sub-layer of silicon 302 also contributes in setting the optimum value of a punch-through voltage so that the sub-layer of silicon 302 can serve an effective charge barrier to keep electrical field in the layer of germanium 400 lower than the avalanche level yet high-enough to allow carriers reaching saturation velocity to have faster transit time. Optionally, the thickness L for the sub-layer of silicon 302 in p doping state is set in a range of about 50 nm to 100 nm.

In the embodiment, the lateral PIN junction structure formed in the lower portion of the central region 300' leads to a carrier multiplication region of the Ge/Si APD in avalanche mode primary restricted in the intrinsic silicon region 300". Thus, a lateral dimension or width w1 of the intrinsic silicon region directly determines the value of breakdown voltage of the PIN junction structure. Optionally, the width w1 of the intrinsic silicon region 300" can be properly controlled by respectively controlling patterning/masking process to properly define the two lateral dimensions of the first sub-region 301 and the second sub-region and their relative locations. Both lateral dimensions are relatively large and process-tolerate, so that the width w1 can be defined flexibly in process. Optionally, the width w1 of the intrinsic silicon region 300" is controlled in a range of 0 to ~200 nm. With a narrower width w1, the breakdown voltage decreases. However, the capacitance of the lateral PIN junction (diode) rises for narrower width, which causes a larger RC delay and consequently results in a lower bandwidth for the Ge/Si APD device. With a wider w1, the breakdown voltage increases while the capacitance decreases to obtain higher bandwidth. However, if the width w1 is further widened, the carrier transit time increases, which will cause decrease of bandwidth. Thus, the width w1 of the intrinsic silicon region between the n+ silicon region and the p+ silicon region in the lateral PIN junction needs to be controlled for achieving desired performance with trade-off in low breakdown voltage and large bandwidth.

Figure 7:
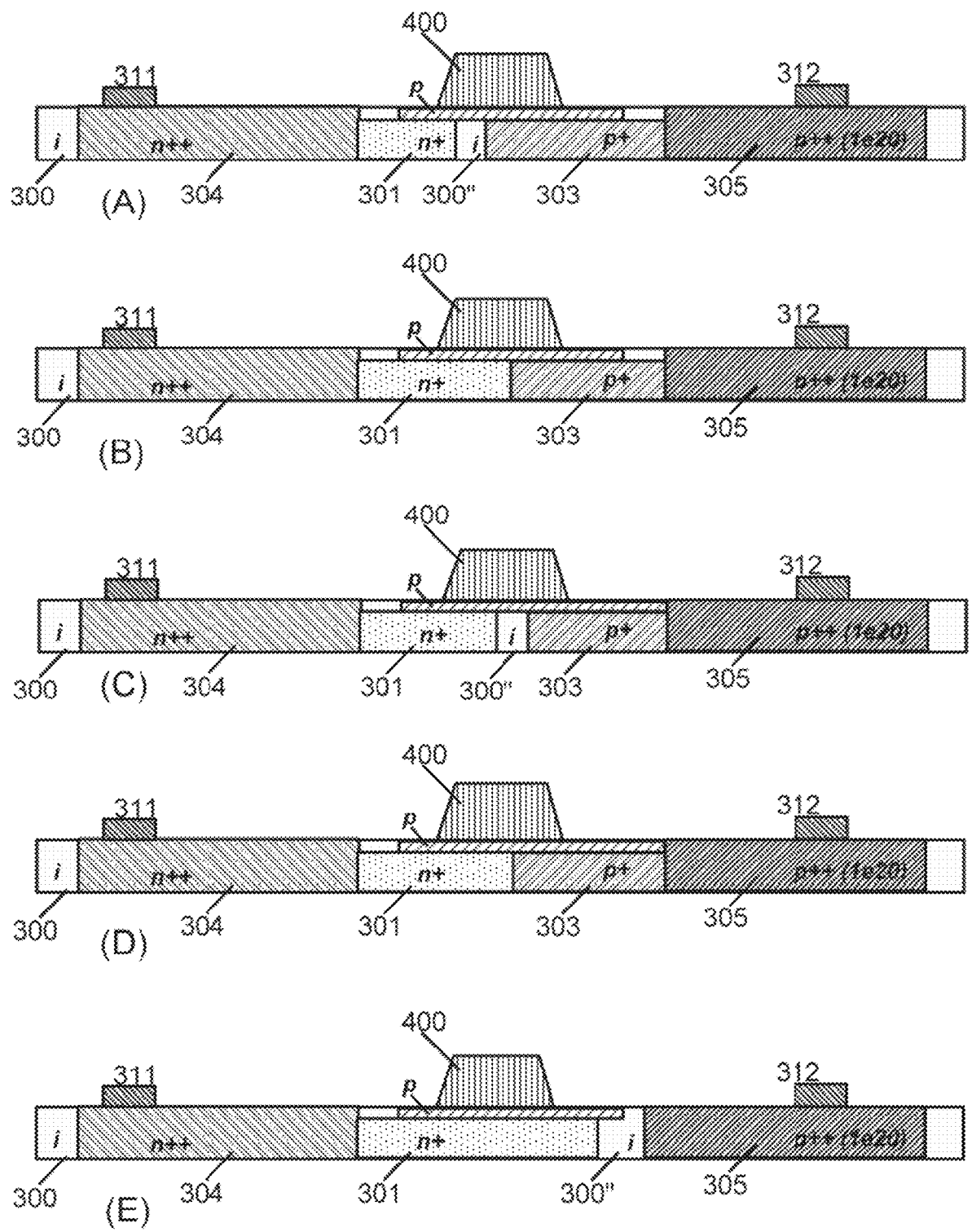
FIG. 7 is a schematic diagram of a germanium-on-silicon avalanche photodetector according to some embodiments of the present disclosure.

In some embodiments, the lateral PIN junction structure described in FIG. 5 has several variations under a same inventive scope. FIG. 7 is a schematic diagram of a germanium-on-silicon avalanche photodetector according to some embodiments of the present disclosure. As shown, all these embodiments of Ge/Si APD has a lateral PIN junction structure formed in a lower portion of silicon device layer in a central region between a first n++ electrode region and a second p++ electrode region with a shallow sub-layer of silicon in p doping state embedded in upper portion of the silicon device layer (part (A) of FIG. 7). The embodiment in part (A) is substantially the same as the one shown in FIG. 5. The lateral dimensions of a n+ sub-region 301 and an i-region 300" (made by intrinsic silicon of original silicon device layer) of the lateral PIN junction are designed to be smaller to provide a narrower carrier multiplication region for the avalanche photodiode, aiming to obtain a lower breakdown voltage for the device. Geographically, the sub-layer of silicon in p doping state is separated from the first n++ electrode region by a gap of intrinsic silicon, which is an additional lateral PIN junction in parallel with the lateral PIN junction mentioned above. However, the p doping level in the sub-layer of silicon is much lower than that of the second sub-region of silicon in p+ doping state. Besides, the optical mode intensity in this gap of intrinsic silicon is weaker than that of the lateral PIN junction mentioned above. Accordingly, the gap of intrinsic silicon between the sub-layer of silicon in p doping state and the first n++ electrode region may form another multiplication region for the device in avalanche mode but its electrical field would be much lower, yielding relatively low side effect. Yet, it is better to keep the gap of intrinsic silicon there to avoid forming a PN junction with unwanted breakdown.

Part (B) of FIG. 7 shows another embodiment in which the i-region 300" has its width being reduced to zero so that the p+ sub-region 303 is directly in contact with the n+ sub-region 301. This leads to a lateral PN junction between the p+ sub-region 303 and the n+ sub-region 301, replacing the lateral PIN junction in embodiment of part (A) of FIG. 7. The carrier multiplication region for the device will be in the depletion region of the PN junction.

Referring further to part (C) of FIG. 7, the embodiment is substantially similar to that of part (A) of FIG. 7. The shallow sub-layer of silicon in p doping state, which is embedded in the upper portion of the silicon device layer substantially covering the lateral PIN junction in the lower portion of the silicon device layer, is configured to be directly in contact with the second electrode region in p++ doping characteristics. While the sub-layer of silicon in p doping state still is separated from the first electrode region in n++ doping state by a gap of intrinsic silicon. Referring to Part (D) of FIG. 7, it shows another embodiment of the Ge/Si APD varied that in part (C) of FIG. 7 by reducing a width of the i-region 300" to zero to make the lateral PIN junction to a PN junction in the lower portion of the central region of the silicon device layer.

Referring to part (E) of FIG. 7, the p+ sub-region 303 in some embodiments shown earlier is completely removed so that the i-region 300" is now in direct contact with the second electrode region 305 in p++ doping state. In this embodiment, the lateral PIN junction structure is formed with the second electrode region 305 in p++ doping state being the P side of the lateral PIN junction instead of a p+ sub-region in the central region of the silicon device layer 300. Effectively, this lateral PIN junction still performs similar function as the lateral PIN junction described in other embodiments: part (A) through part (D) of FIG. 7. Still, there is a shallow sub-layer of silicon in p doping state embedded in the upper part of the silicon device layer to serve as a charge layer for properly separating the light absorption layer in the layer of germanium 400 and the multiplication (avalanche) layer in the i-region 300" located substantially in the lower portion of the silicon device layer to decrease dark current for the Ge/Si APD. The i-region 300" in this embodiment can be made with a narrow width to lead to a low breakdown voltage for the Ge/Si APD.

In an alternative embodiment, a method for manufacturing a Ge-on-Si avalanche photodetector device with low breakdown voltage and high gain in responsivity is provided and specifically shown below by referring to FIG. 2 and FIG. 6. The method includes providing an existing silicon layer as a base substrate for forming the device without a step of growing an epitaxy silicon layer. For example, the silicon layer is provided as a standard silicon device layer of a silicon-on-insulator (SOI) substrate. The SOI substrate is widely used for forming integrated silicon photonics devices including photodiodes, planar waveguides, optical couplers, etc. The Ge-on-Si avalanche photodetector device, as processed via a series of patterning, doping, depositing, masking, ion-implanting, or etching steps performed based on the SOI substrate having the silicon device layer over a buried oxide layer, is configured to be a PIN junction device substantially formed within the silicon device layer with a layer of germanium formed directly thereon in association with a novel separate-absorption-charge-multiplication structure design.

In an embodiment shown in FIG. 2, the method includes forming a vertical PIN junction within the silicon device layer for forming a novel Ge/Si avalanche photodetector. Optionally, the method includes a step of modifying the silicon device layer in intrinsic state to a layer of silicon in modest-heavy n+ doping state. This step includes performing a doping process to dope n-type impurity with a modest-heavy doping level. Optionally, the doping process is an ion-implantation process. Additionally, this step includes patterning at least two separate regions of the silicon device layer and masking the layer to dope n-type impurity with heavy n++ doping level into the two regions, leading to formations of a first electrode region and a second electrode region both in n++ doping state and a central region remained in n+ doping state.

Furthermore in the embodiment, the method includes a step to modify doping characteristics of a part of the central region from the n+ doping state to nearly intrinsic state. This step includes performing a doping process to dope p-type impurity with a modest-heavy doping level into the part of the central region. Optionally, this step includes patterning to at least define an area of the part within the central region. Additionally, the doping process is an ion-implantation process with dose and ionic energy control into the area so that a sub-layer with the area is modified to a nearly intrinsic state from a top surface of the silicon device layer down to a specific depth d.

In the embodiment, the method includes a step to further modify doping characteristics of a part of the sub-layer with substantially the same area. Optionally, the ion-implantation process is following the previous doping of p-type impurity but with lower ionic energy to transform a sub-layer with a shallower depth d2 from the nearly intrinsic state to modest p doping state. Optionally, the doping concentration of the p state is set to $1E12$ $cm^{-3}$ to $5E13$ $cm^{-3}$ in a specific embodiment. This changes the sub-layer of intrinsic state with a thickness d formed in last step to a first sub-layer with a thickness d1=d−d2 in intrinsic state at bottom and a second sub-layer of silicon with a thickness d2 in p doping state on top. Therefore, a vertical PIN junction is formed solely within the silicon device layer including the second sub-layer of silicon in p state from the top surface down to a depth d2, a first sub-layer of silicon in intrinsic state from the depth d2 further down to the depth d, and rest part of the silicon device layer in n+ state. Optionally, the depth or thickness of the second sub-layer of silicon in p doping state is limited to about 50 nm to 100 nm and the thickness d1 of the first sub-layer of silicon in intrinsic state is set in a range from 0 to 150 nm in a specific embodiment.

Moreover, the method includes growing a layer of germanium in intrinsic state directly on the top surface of the silicon device layer, particularly in the area associated with the vertical PIN junction, without any epitaxial silicon in between. Optionally, the lateral dimension of the layer of germanium needs to be smaller than that of the area associated with the vertical PIN junction, otherwise there will be regions with no charge layer beneath the layer of germanium to prevent. Due to lattice mismatch between Ge and Si, the layer of germanium is grown epitaxially on the silicon with stress to form angled hut structure which has a maximum lateral dimension at bottom, i.e., at the top surface of the of the silicon device layer. The maximum lateral dimension of the layer of germanium is set to be smaller than that of the lateral dimension of the second sub-layer of silicon. On top surface of the layer of germanium in intrinsic state, a third sub-layer of germanium with a shallow depth can be modified to a heavy p++ doping level by another ion-implantation process with patterning, masking, dosing, and energy control.

The method also includes coupling the third sub-layer of germanium in p++ doping state to a metallic contact material to form an anode electrode of a Ge/Si photodiode. The method further includes coupling the first electrode region and the second electrode region in the silicon device layer, both in n++ doping state, commonly to a metallic contact material to form one cathode electrode of the Ge/Si photodiode. A reversed bias voltage applied between the anode electrode and cathode electrode may allow the Ge/Si photodiode operable in avalanche mode.

In an alternative embodiment shown in FIG. 6, the method includes forming a lateral PIN junction within the silicon device layer of a SOI substrate for forming a novel Ge/Si avalanche photodetector. Optionally, the method includes a step of modifying the silicon device layer in intrinsic state to form a first electrode region in heavy n++ doping state and a second electrode region in heavy p++ doping state, yielding a width w of central region of silicon device layer remained in intrinsic state between the first electrode region and the second electrode region. This step includes performing a patterning/masking process to define the first electrode region and the second electrode region and the lateral dimensions and locations thereof, which provides the width w of the central region. The step further includes a doping process to dope heavy dose of n or p type impurity respectively to the defined first electrode region and second electrode region. Optionally, the doping process is an ion-implantation process. Optionally, the heavy dose of the p++ dopants is provided a doping concentration on the order of $1E20$ $cm^{-3}$.

In the embodiment, the method also includes a step to modify doping characteristics of a sub-region of the central region from the intrinsic state to n+ doping state. This step includes firstly defining a lateral dimension and location of a first sub-region in the central region followed by a doping process to dope n-type impurity with a modest-heavy doping level into the defined first sub-region. Optionally, the first sub-region is laid to laterally in contact with the first electrode region formed in earlier step. Additionally, the doping process includes an ion-implantation process with dose and ionic energy control so that the first sub-region having a width w1, which is a first part of the width w of the central region, in n+ doping state is formed laterally in contact with the first electrode region in n++ doping state and vertically located below a first depth L1 under a top surface of the silicon device layer.

Additionally, the method includes a step to a nearby sub-region of the central region from the intrinsic state to p+ doping state. This step includes defining a lateral dimension and location of a second sub-region in remaining portion of the central region followed by a doping process to dope p-type impurity with a modest-heavy doping level into the defined second sub-region. Optionally, the second sub-region is laid to laterally in contact with the second electrode region formed in earlier step. Additionally, the doping process includes an ion-implantation process with dose and ionic energy control so that the second sub-region having a width w2, which is a second part of the width w of the central region, in p+ doping state is formed laterally in contact with the second electrode region in p++ doping state and vertically located below a second depth L2 under a top surface of the silicon device layer. Optionally, the width w1 and the width w2 combined are smaller than or at most equal to the width of the central region. The formation of the first sub-region of width w1 and the second sub-region of width w2 naturally leads to a formation of a third sub-region laterally in middle between the first sub-region and the second sub-region. Optionally, the third sub-region has a width w1=w−w1−w2 which remains in intrinsic state as it is part of the original central region of the silicon device layer. As a result of the formation of the first, second, and third sub-region in the width of the central region of the silicon device layer, a lateral PIN junction substantially formed in a lower portion of the central region, including the second sub-region in p+ doping state below the second depth L2, the third sub-region in intrinsic state, and the first sub-region in n+ doping state below a first depth L1. Optionally, the first depth L1 is nearly equal to the second depth L2, though perfect leveling is not necessary. Functionally, the third sub-region of intrinsic silicon is served as a carrier multiplication region for the Ge/Si avalanche photodetector. The width w1 of the intrinsic sub-region is preferred to be kept to a relatively small value to help reduce the breakdown voltage of the Ge/Si photodiode operated in avalanche mode. In a specific embodiment, the width w1 is set in a range of 0 to 200 nm. As the lateral dimension controlled is limited to control relatively larger width w1 and w2 for the first sub-region and the second sub-region, the width w1 as the multiplication region can be controlled easily in manufacture process. Optionally, the width w1 is reduced to zero so that the first sub-region in n+ doping state is laterally in contact with the second sub-region in p+ doping state. In this case, the lateral PIN junction is reduced to a PN junction and the depletion region formed during the photodiode operation will become a multiplication region.

In the embodiment, the formation of the lateral PIN junction in lower portion of the central region leaves a sub-layer of silicon having a shallow thickness of L ~L1 or L2 in an upper portion of the central region in intrinsic state. Optionally, the first depth L1 or the second depth L2 is roughly controlled to be in a range of about 50 nm to 100 nm. Moreover, the method includes a step of modify the sub-layer of silicon in intrinsic state in the upper portion at least partially into a sub-layer of silicon in modest p doping state. Optionally, this step includes a patterning/masking process to define lateral scale wp and location of the to-be modified sub-layer of silicon followed by a doping process to dope modest dose of p-type impurity with energy control to embed the sub-layer of silicon in p doping state from the top surface of the silicon device layer down to the thickness L thereof. Optionally, the sub-layer of silicon in p doping state with a lateral dimension wp is at least separated from the first electrode region in n++ doping state by a gap of intrinsic silicon. Optionally, the sub-layer of silicon in p doping state is laterally within the width w of central region, i.e., at least wp<w. Optionally, the sub-layer of silicon in p doping state in upper portion of the central region directly overlays the lateral PIN junction in lower portion of the central region. In particular, the sub-layer of silicon in p doping state is in contact from above with each of the first sub-region in n+ doping region, the second sub-region in p+ doping region, and the third intrinsic silicon region in the middle. Functionally, the sub-layer of silicon in modest p doping state serves a charge barrier to separate a light absorption layer (to be formed on top of the sub-layer of silicon) and the carrier multiplication region in the lateral PIN junction at lower portion of the central region. The thickness L of about 50 nm to 100 nm, in some embodiments, serves a preferred range for forming a reliable charge barrier characterized by a proper punch-through voltage being set to be slightly smaller than breakdown voltage for the Ge/Si avalanche photodiode. This leads to a Ge/Si APD device with low breakdown voltage, high gain in photo responsivity, and fast in transit time for operation in wide O band or C band optical communication.

Furthermore, the method includes growing a layer of germanium in intrinsic state directly on the top surface of silicon device layer without performing any silicon epitaxy process. In the embodiment, the layer of germanium is grown epitaxially with stress due to lattice mismatch between Ge and Si, with a maximum lateral dimension within the lateral scale wp of the sub-layer of silicon in p doping state. For Germanium with a bandgap of 0.67 eV, the absorption spectra cover the optical communication O band and C band, making the layer of germanium a good candidate as a light absorption region of the Ge/Si based photodetector.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An avalanche photodetector comprising:
   a silicon layer having a junction embedded in the silicon layer, the junction being a p-type-intrinsic-n-type (PIN) junction or a p-type-n-type (PN) junction and formed of
      a first embedded layer disposed beneath an external surface of the silicon layer, the first embedded layer comprising i) a first sub-region doped in a n+ doping state, and ii) a second sub-region disposed laterally from the first sub-region and doped in a p+ doping state, and
      a second embedded layer disposed above the first embedded layer, the second embedded layer being (i) in contact with the external surface of the silicon layer, and (ii) comprising a sub-region doped in a p doping state;
   an epitaxial germanium layer formed over the junction, the epitaxial germanium layer being in either an intrinsic state or a p doping state and being configured to function as a light absorption layer to absorb light; and
   a plurality of electrode regions formed at least in the silicon layer, the electrode regions being configured to apply a reverse bias voltage across the junction to induce a photoelectric effect to convert light energy to electrical energy.

2. The avalanche photodetector of claim 1, wherein the first sub-region and the second sub-region are at a same depth in the silicon layer.

3. The avalanche photodetector of claim 1, wherein:
   the plurality of electrode regions comprise a first electrode region and a second electrode region;
   the first electrode region and the second electrode region are disposed laterally from the junction; and
   the first electrode region and the second electrode region are at a same depth as the first sub-region and the second sub-region.

4. The avalanche photodetector of claim 1, wherein the first embedded layer comprises a third sub-region disposed between the first sub-region and the second sub-region, the third sub-region being in an intrinsic state.

5. The avalanche photodetector of claim 4, wherein:
   the plurality of electrode regions comprise a first electrode region and a second electrode region disposed laterally from the junction; and
   a width of the first sub-region, measured from the first electrode region to the third sub-region, is less than a width of the second sub-region measured from the third sub-region to the second electrode region.

6. The avalanche photodetector of claim 4, wherein:
   the plurality of electrode regions comprise a first electrode region and a second electrode region disposed laterally from the junction; and
   the second embedded layer is not in contact with the first electrode region and is not in contact with the second electrode region.

7. The avalanche photodetector of claim 4, wherein:
the plurality of electrode regions comprise a first electrode region and a second electrode region disposed laterally from the junction; and
the second embedded layer is not in contact with the first electrode region and is in contact with the second electrode region.

8. The avalanche photodetector of claim 4, wherein:
the plurality of electrode regions comprise a first electrode region and a second electrode region disposed laterally from the junction; and
a width of the third sub-region is equal to a distance between the first electrode region and the second electrode region minus a width of the first sub-region and a width of the second sub-region.

9. The avalanche photodetector of claim 1, wherein the first sub-region is in direct contact with the second sub-region.

10. The avalanche photodetector of claim 9, wherein:
the plurality of electrode regions comprise a first electrode region and a second electrode region disposed laterally from the junction; and
the second embedded layer is not in contact with the first electrode region and is not in contact with the second electrode region.

11. The avalanche photodetector of claim 9, wherein:
the plurality of electrode regions comprise a first electrode region and a second electrode region disposed laterally from the junction; and
the second embedded layer is not in contact with the first electrode region and is in contact with the second electrode region.

12. The avalanche photodetector of claim 1, wherein:
the plurality of electrode regions comprise a first electrode region and a second electrode region disposed laterally from the junction; and
a width of the second embedded layer, measured laterally from a first peripheral outer edge of the second embedded layer facing the first electrode region to a second peripheral outer edge of the second embedded layer facing the second electrode region, is less than a width of the junction measured laterally from a peripheral outer edge of the first sub-region facing the first electrode region to a peripheral outer edge of the second sub-region facing the second electrode region.

13. The avalanche photodetector of claim 1, wherein at least one of:
a thickness of the junction is 120-170 nanometers; and
a thickness of the second embedded layer is 50-100 nanometers.

14. The avalanche photodetector of claim 1, wherein the second embedded layer comprises an intrinsic sub-region disposed between one of the plurality of electrode regions and the sub-region of the second embedded layer doped in the p doping state.

15. The avalanche photodetector of claim 1, wherein:
the second embedded layer comprises two intrinsic sub-regions;
the sub-region of the second embedded layer doped in the p doping state is disposed between the two intrinsic sub-regions; and
one of the two intrinsic sub-regions is disposed on the first sub-region and the other one of the two intrinsic sub-regions is disposed on the second sub-region.

16. The avalanche photodetector of claim 1, wherein a p-type doping concentration of the second embedded layer is between 1e12 $cm^{-3}$ and 5e13 $cm^{-3}$.

17. The avalanche photodetector of claim 1, wherein the epitaxial germanium layer tapers away from the silicon layer, wherein a first width of the epitaxial germanium layer measured at the junction is greater than a second width of the epitaxial germanium layer measured at a surface of the epitaxial germanium layer further away from the junction.

18. The avalanche photodetector of claim 1, further comprising an oxide layer,
wherein the silicon layer is disposed on the oxide layer to provide a silicon-on-insulator substrate.

19. The avalanche photodetector of claim 1, wherein the plurality of electrode regions comprise:
a first electrode region disposed in the silicon layer, the first electrode region being doped in a n++ doping state; and
a second electrode region disposed in the silicon layer, the second electrode region being doped in a p++ doping state.

20. The avalanche photodetector of claim 19, wherein the junction is disposed between the first electrode region and the second electrode region.

* * * * *